United States Patent
Sato

(10) Patent No.: US 10,306,771 B2
(45) Date of Patent: May 28, 2019

(54) ANISOTROPIC CONDUCTIVE FILM AND METHOD OF PRODUCING THE SAME

(71) Applicant: DEXERIALS CORPORATION, Tokyo (JP)

(72) Inventor: Kouichi Sato, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 1118 days.

(21) Appl. No.: 14/420,982

(22) PCT Filed: Aug. 28, 2013

(86) PCT No.: PCT/JP2013/073053
§ 371 (c)(1),
(2) Date: Feb. 11, 2015

(87) PCT Pub. No.: WO2014/034741
PCT Pub. Date: Mar. 6, 2014

(65) Prior Publication Data
US 2015/0319867 A1 Nov. 5, 2015

(30) Foreign Application Priority Data
Aug. 29, 2012 (JP) ................................. 2012-188608

(51) Int. Cl.
*H05K 1/16* (2006.01)
*H05K 3/32* (2006.01)
(Continued)

(52) U.S. Cl.
CPC ....... *H05K 3/323* (2013.01); *C09D 123/0853* (2013.01); *C09J 123/0853* (2013.01);
(Continued)

(58) Field of Classification Search
CPC ... H01L 2224/16238; H01L 2224/2711; H01L 2224/29082; H01L 2224/2929;
(Continued)

(56) References Cited

U.S. PATENT DOCUMENTS 6,042,894 A 3/2000 Goto et al.
8,008,582 B2 * 8/2011 Shimada ................. H01L 24/29
174/257

(Continued)

FOREIGN PATENT DOCUMENTS

CN 1809899 A 7/2006
JP H04301382 A 10/1992
(Continued)

OTHER PUBLICATIONS

Jan. 18, 2017 Office Action issued in Korean Patent Application No. 10-2014-7033239.
(Continued)

*Primary Examiner* — Angel R Estrada
(74) *Attorney, Agent, or Firm* — Oliff PLC

(57) ABSTRACT

An anisotropic conductive film including conductive particles arranged uniformly in a single layer and capable of supporting fine-pitch connection is produced by: drying a coating film of a particle dispersion in which conductive particles are dispersed in a dilute solution of a thermoplastic resin that forms a coating after drying, whereby a conductive particle-containing layer is formed in which the coated conductive particles coated with the dried coating of the dilute solution of the thermoplastic resin and arranged in a single layer stick to the dried coating film; and laminating an insulating resin layer onto the conductive particle-containing layer.

16 Claims, 5 Drawing Sheets

(51) Int. Cl.
*H05K 1/11* (2006.01)
*H05K 1/18* (2006.01)
*H05K 3/30* (2006.01)
*H05K 3/40* (2006.01)
*C09D 123/08* (2006.01)
*C09J 123/08* (2006.01)

(52) U.S. Cl.
CPC ............... *H05K 1/11* (2013.01); *H05K 1/181* (2013.01); *H05K 3/303* (2013.01); *H05K 3/4007* (2013.01); *H05K 2201/0221* (2013.01); *H05K 2201/10166* (2013.01); *H05K 2203/04* (2013.01); *H05K 2203/066* (2013.01); *Y10T 29/49146* (2015.01); *Y10T 428/254* (2015.01)

(58) Field of Classification Search
CPC ... H01L 2224/2939; H01L 2224/29444; H01L 2224/29499; H01L 2224/32225; H01L 2224/81193; H01L 24/27; H01L 24/29; H01L 24/32; B32B 37/185; B32B 3/30; B32B 27/20; B32B 37/025; B32B 37/24; B32B 37/1207; B32B 2037/1253; B32B 2307/202; B32B 2310/0831; B32B 2457/00; B32B 37/34; H05K 3/323; H05K 2201/10106; H05K 2201/10674; H05K 2201/09945; H05K 1/11; H05K 1/181; H05K 3/303; H05K 3/4007; H05K 2201/10166; H05K 2203/04; H05K 2203/066; Y10T 428/24562; Y10T 29/49146; C09D 123/0853; C09J 123/0853
USPC ....... 174/259, 260, 255, 256, 520, 261, 262, 174/264, 265; 428/40.1, 143, 148, 180, 428/179
See application file for complete search history.

(56) References Cited

U.S. PATENT DOCUMENTS

| | | | | |
|---|---|---|---|---|
| 8,124,885 B2* | 2/2012 | Yamada | ............. | H01R 12/7082 174/262 |
| 9,953,947 B2* | 4/2018 | Tsukao | ..................... | H01L 24/32 |
| 9,960,139 B2* | 5/2018 | Sato | ................... | H01L 24/29 |
| 9,997,486 B2* | 6/2018 | Akutsu | .................... | H01L 24/27 |
| 10,026,709 B2* | 7/2018 | Akutsu | .................... | H01L 24/32 |
| 2010/0188829 A1 | 7/2010 | Ito et al. | | |

FOREIGN PATENT DOCUMENTS

| | | | |
|---|---|---|---|
| JP | H06-022084 B2 | 3/1994 |
| JP | H07-302668 A | 11/1995 |
| JP | H09-118860 A | 5/1997 |
| JP | 2002-519473 A | 7/2002 |
| JP | 2007-115560 A | 5/2007 |
| JP | 2008-034232 A | 2/2008 |
| JP | 2010-009804 A | 1/2010 |
| JP | 2010-033793 A | 2/2010 |
| JP | 4789738 B2 | 10/2011 |
| JP | 2014-063729 A | 4/2014 |
| JP | 2014-130824 A | 7/2014 |
| JP | 2016-103476 A | 6/2016 |
| KR | 2001-0053298 A | 6/2001 |
| KR | 2008-0111500 A | 12/2008 |
| WO | 2007/0125993 A1 | 11/2007 |
| WO | 20091037964 A1 | 3/2009 |
| WO | 2011/040458 A1 | 4/2011 |

OTHER PUBLICATIONS

Jan. 3, 2017 Office Action issued in Taiwanese Patent Application No. 102131011.
May 31, 2017 Office Action issued in Korean Patent Application No. 2014-7033239.
Jul. 15, 2017 Office Action issued in Korean Patent Application No. 10-2014-7033239.
Jul. 15, 2017 Office Action issued in Korean Patent Application No. 10-2017-7018236.
Jul. 15, 2017 Request for Agreement issued in Korean Patent Application No. 10-2017-7018236.
Nov. 27, 2017 Office Action issued in Japanese Patent Application No. 2016-198884.
Jan. 17, 2018 Office Action issued in Taiwanese Application No. 106115306.
Mar. 29, 2018 Office Action issued in Korean Application No. 10-2017-7018236.
Feb. 23, 2017 Office Action issued in Chinese Patent Application No. 201380044670.7.
Jul. 4, 2017 Office Action issued in Japanese Patent Application No. 2016-198884.
Dec. 28, 2017 Office Action issued in Korean Patent Application No. 10-2017-7018236.
Search Report issued in International Application No. PCT/JP2013/073053 dated Dec. 3, 2013.
Jun. 21, 2016 Office Action issued in Chinese Patent Application No. 201380044670.7.
Aug. 24, 2016 Office Action issued in Taiwanese Patent Application No. 102131011.
May 17, 2016 Office Action issued in Japanese Patent Application No. 2013-177080.
Sep. 17, 2018 Office Action issued in Korean Application No. 10-2018-7012207.
Dec. 26, 2018 Office Action issued in Chinese Application No. 201710384614.8.
Mar. 19, 2019 Office Action issued in Japanese Application No. 2018-121397.
Apr. 1, 2019 Office Action issued in Korean Application No. 10-2018-7012207.

* cited by examiner (a) PREPARE PARTICLE DISPERSION (b) FORM COATING FILM OF PARTICLE DISPERSION (c) DRY COATING FILM OF PARTICLE DISPERSION (d) LAMINATE CONDUCTIVE PARTICLE-CONTAINING LAYER AND INSULATING RESIN LAYER

ANISOTROPIC CONDUCTIVE FILM AND METHOD OF PRODUCING THE SAME

TECHNICAL FIELD

The present invention relates to an anisotropic conductive film and a method of producing the same.

BACKGROUND ART

Anisotropic conductive films are widely used to mount electronic components, such as IC chips. A recent task to support fine-pitch connection is to achieve favorable electric connection in fine-pitch circuits and improve insulation between adjacent circuits. In one anisotropic conductive film proposed to achieve the task, conductive particles are arranged at specific intervals by utilizing biaxial stretching of the film, and insulating particles are disposed between the conductive particles (Patent Literature 1).

CITATION LIST

Patent Literature

Patent Literature 1: Japanese Patent Application Laid-Open No. 2010-9804

SUMMARY OF INVENTION

Technical Problem

In a process of producing the anisotropic conductive film in Patent Literature 1, an adhesive layer is formed on a biaxially stretchable film, and the conductive particles are spread in layers on the adhesive layer. Then excess conductive particles are scraped with a scraper to arrange the remaining conductive particles in a single layer. In this case, the conductive particles may thus be damaged. In addition, the degree of technical difficulty of this process is high. It is also difficult to ensure uniform spacing between the conductive particles when the conductive particles are arranged in a single layer, and it is therefore difficult to stably produce an anisotropic conductive film that can support fine-pitch connection.

In view of the above problems in the conventional technology, it is an object of the present invention to allow an anisotropic conductive film including conductive particles arranged uniformly in a single layer and capable of supporting fine pitch connection to be produced stably using an industrially simple method.

Solution to Problem

The present inventor has found that, when a coating layer of a particle dispersion prepared by dispersing conductive particles in a dilute solution of a thermoplastic resin that forms a coating after drying is dried, the conductive particles coated with the coating of the thermoplastic resin stick to the dried coating film while dispersed uniformly and arranged in a single layer. The present inventor has also found that, by utilizing this method of forming a dried film of a dilute resin solution, an anisotropic conductive film including conductive particles arranged in a single layer with their interparticle distance controlled can be easily produced. Thus, the present invention has been completed.

Accordingly, the present invention provides a method of producing an anisotropic conductive film, the method including: drying a coating film of a particle dispersion in which conductive particles are dispersed in a dilute solution of a thermoplastic resin that forms a coating after drying, whereby a conductive particle-containing layer is formed in which the coated conductive particles coated with the dried coating of the dilute solution of the thermoplastic resin and arranged in a single layer stick to the dried coating film; and laminating an insulating resin layer onto the conductive particle-containing layer. The conductive particle-containing layer may be formed using a transfer die having a regular pattern.

The present invention also provides an anisotropic conductive film including: a conductive particle-containing layer including a dried coating film of a dilute solution of a thermoplastic resin and coated conductive particles that are coated with a dried coating of the dilute solution of the thermoplastic resin and stick to the dried coating film while arranged in a single layer; and an insulating resin layer laminated onto the conductive particle-containing layer.

The present invention also provides a method of connecting a terminal of a first electronic component to a terminal of a second electronic component by anisotropic conductive connection using the above-described anisotropic conductive film, the method including:

temporarily applying the anisotropic conductive film onto the second electronic component;

temporarily placing the first electronic component on the temporarily applied anisotropic conductive film; and then heating and pressurizing the first electronic component, the anisotropic conductive film, and the second electronic component. The present invention also provides a connected assembly comprising the first electronic component and the second electronic component connected using the above method of connecting.

Advantageous Effects of Invention

According to the anisotropic conductive film production method of the present invention, an anisotropic conductive film in which conductive particles arranged in a single layer are disposed with a uniform interparticle distance can be easily produced, and the interparticle distance can be easily controlled. Therefore, an anisotropic conductive film that can support fine pitches can be industrially produced in a stable manner.

With the anisotropic conductive film obtained using the above production method, favorable electric connection can be obtained even for fine-pitch conductive terminals, i.e., even when, for example, the spacing between the conductive terminals to be connected is 5 μm to 15 μm, and the insulation between adjacent terminals can be improved. In addition, by arranging the conductive particles in a pattern, more preferred electric connection can be established between the fine-pitch conductive terminals. For some designs, the anisotropic conductive film can be used for electrical connection between conductive terminals with a wider pitch.

DESCRIPTION OF EMBODIMENTS

The present invention will next be described in detail with reference to the drawings.

<<Anisotropic Conductive Film Production Method A of the Present Invention>>

Figure 1:
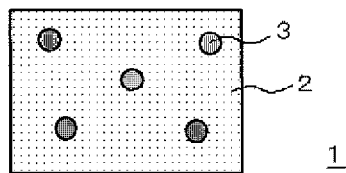
FIG. 1 is a series of diagrams illustrating steps in a method of producing an anisotropic conductive film in an embodiment.
Figure 1:
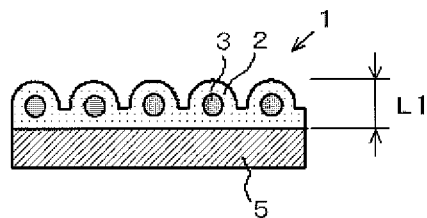
Figure 1:
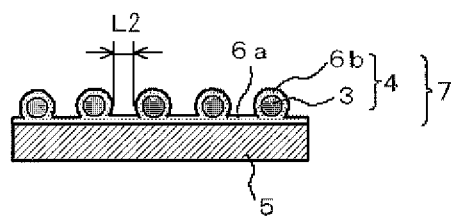
Figure 1:
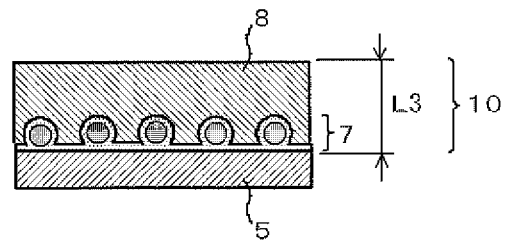

FIG. 1 is a series of diagrams illustrating steps in an anisotropic conductive film production method in an embodiment of the present invention. Each of the steps will next be described.

<Step of Preparing Particle Dispersion>

In this embodiment, first, a particle dispersion 1 is prepared in which conductive particles 3 are dispersed in a dilute solution 2 of a thermoplastic resin that forms a coating after drying, as shown in FIG. 1(a).

The conductive particles 3 may be, for example, conductive particles used for known anisotropic conductive films, and examples of such conductive particles may include metal-coated resin particles produced by plating resin-made cores with nickel, gold, etc. and particles of metals such as nickel, cobalt, gold, silver, copper, and palladium. One type of such particles or a combination of two or more types may be used. When the conductive particles 3 are metal particles, spherical particles having a size, i.e., diameter, of 0.2 to 5 μm, flake-like particles having a thickness of 0.2 to 0.4 μm and a diameter of 1 to 10 μm, etc. can be preferably used. When the conductive particles 3 are metal-coated resin particles, spherical particles having a diameter of preferably 1 to 20 μm and more preferably 3 to 10 μm, flake-like particles, rugby ball-shaped particles, etc. can be used.

The amount of the conductive particles 3 contained in the particle dispersion 1 is preferably 1 to 20 wt %. If the added amount of the conductive particles is too large, it is difficult to obtain an anisotropic conductive film that support fine-pitch anisotropic conductive connection. If the added amount is too small, a particle capturing rate decreases, and it is difficult to connect terminals reliably.

The dilute thermoplastic resin solution 2 contains the thermoplastic resin and a solvent. In the dilute thermoplastic resin solution 2, the thermoplastic resin is swelled, dissolved, or suspended. The thermoplastic resin is preferably a resin that is precipitated when the solvent is removed by drying to thereby form a coating readily and can easily coat the conductive particles 3. Preferably, the thermoplastic resin has a softening point of 50 to 90° C. and exhibits flowability when heated during connection of terminals, from the viewpoint of ensuring electric conductivity when the terminals are connected using the anisotropic conductive film. Examples of such a thermoplastic resin may include ethylene-vinyl acetate copolymer resins (EVAs), polyolefin-based resins, polystyrene-based resins, and acrylate resins. Of these, EVAs are preferred.

Preferably, the solvent used for the dilute thermoplastic resin solution 2 contains a poor solvent for the thermoplastic resin so that a dried coating can be easily formed by drying a coating film of the dilute thermoplastic resin solution 2. More specifically, an appropriate mixture of a good solvent such as toluene or MEK and a poor solvent such as ethanol or IPA may be used, although this depends on the type of the thermoplastic resin.

The concentration of the thermoplastic resin present as a solid in the dilute thermoplastic resin solution 2 can be appropriately set in order to adjust the interparticle distance of the conductive particles in the anisotropic conductive film to a prescribed value. In the anisotropic conductive film of the present invention, the interparticle distance L2 (FIG. 1(c)) of coated conductive particles 4 obtained by coating the conductive particles 3 with a dried coating 6b of the thermoplastic resin is preferably 0.5 to 10 μm and more preferably 1 to 6 μm from the viewpoint of ensuring insulating properties. Therefore, the concentration of the thermoplastic resin present as a solid in the dilute thermoplastic resin solution 2 is preferably 0.1 to 30 wt % and more preferably 2 to 15 wt %.

In terms of the concentration of the conductive particles 3 in the dilute thermoplastic resin solution 2, as the concentration increases, the interparticle distance L2 of the coated conductive particles 4 tends to increase. Therefore, the interparticle distance L2 of the coated conductive particles 4 can be controlled by adjusting the concentration of the conductive particles 3 in the dilute thermoplastic resin solution 2.

As a method for preparing the particle dispersion 1, it is preferable to first prepare a solution of the thermoplastic resin and also obtain a dispersion of the conductive particles 3 in a poor solvent for the thermoplastic resin, and add the solution of the thermoplastic resin gradually to the dispersion to disperse the thermoplastic resin in the dispersion. Alternatively, first, a dilute thermoplastic resin solution is obtained, and then the conductive particles are dispersed in the dilute solution. In this case, the conductive particles are in an aggregated state. The "aggregated state" means aggregates in which a proper distance is maintained between the individual particles. In the present invention, the "aggregated state" also encompasses a state in which particles not in contact with each other form clusters distanced from each other. The particle dispersion may be simply prepared by dispersing the conductive particles in a solvent and then adding, to the dispersion, the thermoplastic resin that forms a coating after drying.

In the embodiment shown in FIG. 1, the above-described particle dispersion 1 is applied to a release substrate 5 such as a PET film, a PEN (polyethylene naphthalate) film, or an OPP film (biaxially oriented polypropylene film) (FIG. 1(b)). Preferably, in this case, a bar coater or a roll coater, for example, is used for the coating process, and the particle dispersion 1 is applied such that the coated conductive particles do not overlap in the direction of the thickness of the coating film and are arranged in a single layer. The particle dispersion 1 is applied in such an amount that the thickness L1 of the coating film in portions in which the conductive particles 3 are present is preferably 1 to 10 μm and more preferably 1 to 7 μm, from the viewpoint of drying and film formation.

After the particle dispersion 1 is applied to the release substrate 5, an additional release film may be laminated onto the coating film of the particle dispersion 1. In this case, the coating film is spread, and the coating on each particle is thereby deformed into an anisotropic shape such as a disk shape, so that the movement of the conductive particles in a plane direction can be suppressed. The additional release film may be removed after the coating film is spread.

<Step of Drying Coating Film of Particle Dispersion>

Next, the coating film of the particle dispersion 1 on the release substrate 5 is dried. A conductive particle-containing layer 7 is thereby formed (FIG. 1(c)). In the conductive particle-containing layer 7, the coated conductive particles 4, i.e., the conductive particles 3 coated with the dried coating 6b of the dilute thermoplastic resin solution, stick to the dried coating film 6a of the dilute thermoplastic resin solution on the release substrate 5. The conductive particles 3 are arranged in a single layer and do not overlap each other in the direction of the thickness of the coating film. In the conductive particle-containing layer 7, the coated conductive particles 4 are uniformly dispersed on the dried coating film 6a of the dilute thermoplastic resin solution, and variations in interparticle distance therebetween are suppressed significantly.

Preferably, the temperature when the coating film of the particle dispersion 1 is dried is higher than the softening point of the thermoplastic resin and equal to or lower than the boiling point of the solvent. In this case, the coated conductive particles 4 can be fused onto the dried coating film 6a of the dilute thermoplastic resin solution on the release substrate 5, and the uniformly dispersed state of the coated conductive particles 4 in the conductive particle-containing layer 7 can be stabilized.

<Step of Laminating Insulating Resin Layer>

Next, an insulating resin layer 8 is laminated onto the conductive particle-containing layer 7, whereby an anisotropic conductive film 10 in this embodiment in which the conductive particle-containing layer 7 and the insulating resin layer 8 are laminated can be obtained (FIG. 1(d)).

The insulating resin layer 8 may be formed from an insulating resin layer-forming paint containing a film-forming resin, a curable component, a curing agent, etc. and used for known anisotropic conductive films. Preferably, the insulating resin layer 8 has tackiness. Preferably, the coating on the coated conductive particles contributes to the development of the tackiness. In this case, to obtain the contribution, for example, a tiny amount of a solvent or a monomer with high affinity for coating is mixed or caused to remain in the insulating resin layer 8.

Examples of the film-forming resin may include phenoxy resins, epoxy resins, unsaturated polyester resins, saturated polyester resins, urethane resins, butadiene resins, polyimide resins, polyamide resins, and polyolefin resins. Two or more types of resins may be used in combination. Of these, a phenoxy resin can be used preferably from the viewpoint of the ease of film formation, processability, and connection reliability.

Examples of the curable component may include liquid epoxy compounds and acrylic monomers. Examples of the liquid epoxy compounds may include bisphenol A-type epoxy compounds, bisphenol F-type epoxy compounds, novolac-type epoxy compounds, compounds obtained by modifying the above epoxy compounds, and alicyclic epoxy compounds. Two or more types of compounds may be used in combination. Examples of the curing agent in this case may include thermal- and photo-anionic curing agents such as polyamines and imidazole, thermal- and photo-cationic curing agents such as sulfonium salts, and thermal- and photo-latent curing agents such as phenol-based curing agents.

Examples of the acrylic monomers may include ethyl (meth)acrylate. Examples of the curing agent (thermal- or photo-radical polymerization initiator) in this case may include organic peroxides and azobisisobutyronitrile.

As a method of laminating the insulating resin layer 8 onto the conductive particle-containing layer 7, for example, the insulating resin film is produced in advanced, and then the produced insulating resin film is laminated onto the conductive particle-containing layer 7. In this case, the insulating resin film used may be, for example, a film produced by: forming a coating film using an insulating resin layer-forming paint containing (i) the above-described film-forming resin, (ii) the above-described curable component that exhibits tackiness, and (iii) the above-described curing agent for the curable component; and then curing the coating film.

<<Anisotropic Conductive Film Production Method B of the Present Invention>>

Figure 3A:
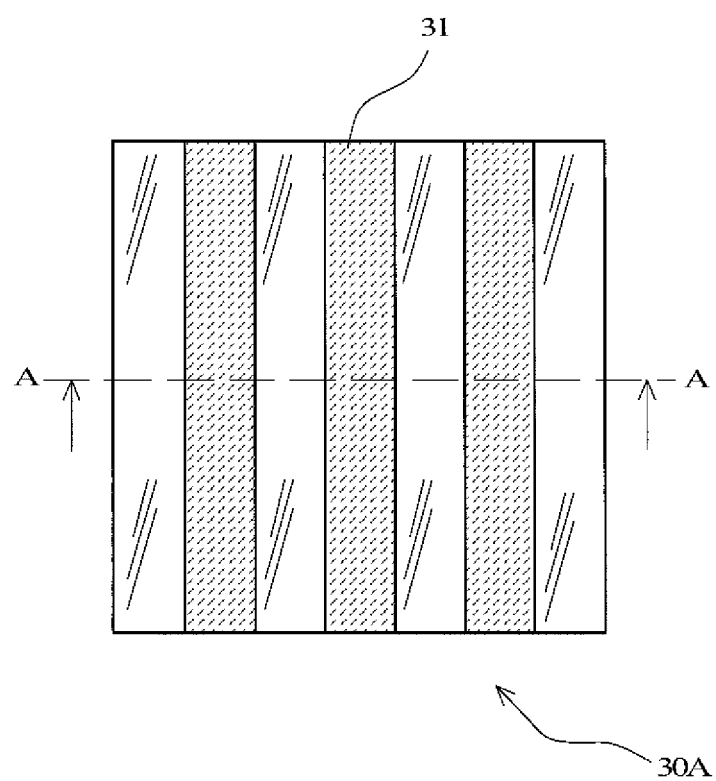
FIG. 3A is a plan view of a transfer die having a linear pattern and capable of being used to produce an anisotropic conductive film.
Figure 3B:
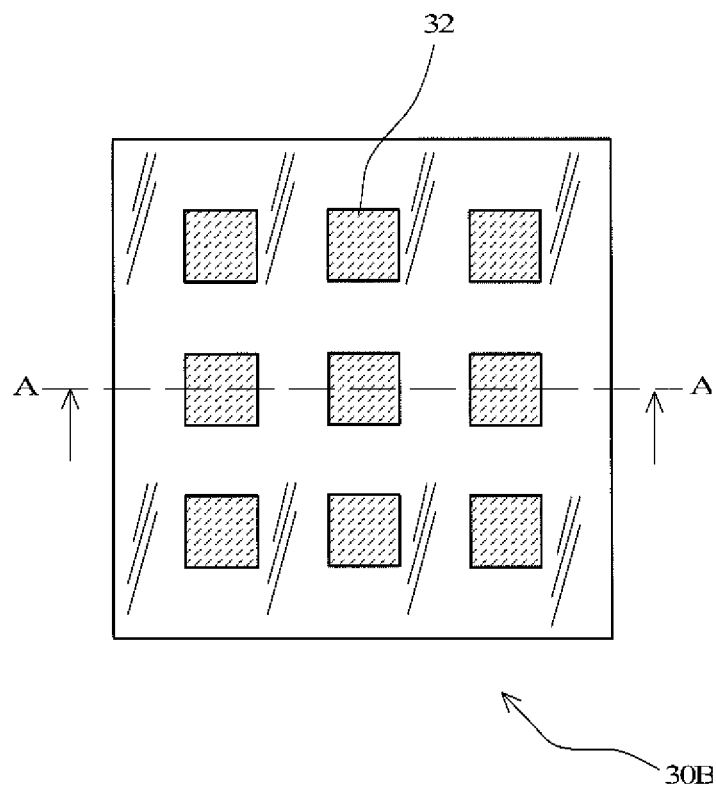
FIG. 3B is a plan view of a transfer die having an island pattern and capable of being used to produce an anisotropic conductive film.

The anisotropic conductive film of the present invention can also be produced by forming a conductive particle-containing layer using a transfer die having a regular pattern such as a transfer die 30A or 30B shown in FIG. 3A or 3B. In this case, the interparticle distance can be easily ensured, and the interparticle pitch can be increased.

Figure 3C:
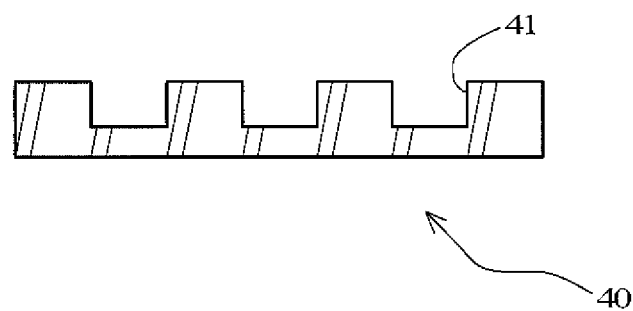
FIG. 3C is a cross-sectional view taken along line A-A in any of the transfer dies in FIGS. 3A and 3B.

FIG. 3A is a plan view of the transfer die 30A in which liner grooves 31 are formed, and FIG. 3B is a plan view of the transfer die 30B in which island-shaped square recesses 32 are formed. The shape of the grooves 31 or the recesses 32 in A-A cross-sections of these transfer dies is a rectangle having a width of 5 to 200 μm and a depth of 5 to 40 μm as shown in FIG. 3C, and the grooves 31 or the recesses 32 (hereinafter referred to as dents 41) are formed on one side of a transfer die 40 (the transfer dies 3A and 3B are collectively referred to as transfer die 40). When such a transfer die is used to produce an anisotropic conductive film, it is preferable to use steps described below. These steps will be described with reference to cross-sectional views. The shape of the transfer die can be freely designed. In order to prevent a short circuit in a more reliable manner, it is preferable to produce a die to have a pattern shape that allows conductive particle groups composed of a plurality of conductive particles to be arranged in a pattern including discontinuous independent lines, islands, dots, etc. The pattern shape is not limited to lines. The minimum distance in the pattern shape may define such a space in which 1 to 2 coated particles can be present. This is because, when the space accommodates only one coated particle, the occurrence rate of regions in which no particle is present increases. The use of such a pattern can ensure insulating regions in a reliable manner and effectively improves reliability. Also from the viewpoint of productivity, the use of the pattern allows inspection to be easily performed, and a defective can be easily extracted. This is advantageous for improvement in quality.

<Step of Preparing Particle Dispersion>

First, also in this embodiment, a particle dispersion 1 in which conductive particles 3 are dispersed in a dilute solution 2 of a thermoplastic resin that forms a coating after drying is prepared, as shown in FIG. 1(a).

<Step of Applying Particle Dispersion to Transfer Die>

Figure 4A:
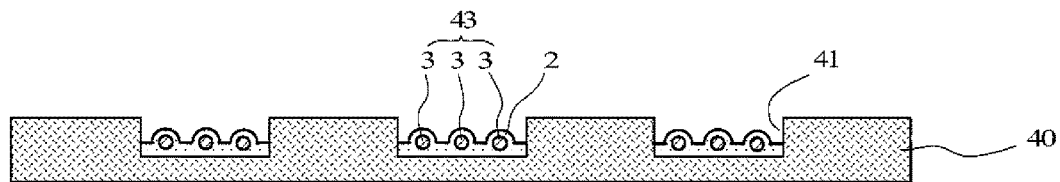
FIG. 4A is a diagram illustrating a step in an anisotropic conductive film production method using a transfer die.

A coating film of the particle dispersion 1 having a prescribed thickness is formed on the transfer die 40, and the particle dispersion 1 on the surface of the transfer die 40 is scraped with a known wiper (FIG. 4A). The dents 41 are thereby filled with the dilute thermoplastic resin solution 2 in which the conductive particles 3 are dispersed. The number of conductive particles 3 entering each dent 41 varies depending on the size of the conductive particles 3, the width and depth of the dents 41, the concentration of the conductive particles 3 in the particle dispersion, etc. Generally, each dent 41 is filled with a plurality of conductive particles 3 arranged in a single layer and constituting a conductive particle group 43.

<Step of Transferring Conductive Particle Groups 43 to Release Film and Drying>

Figure 4B:
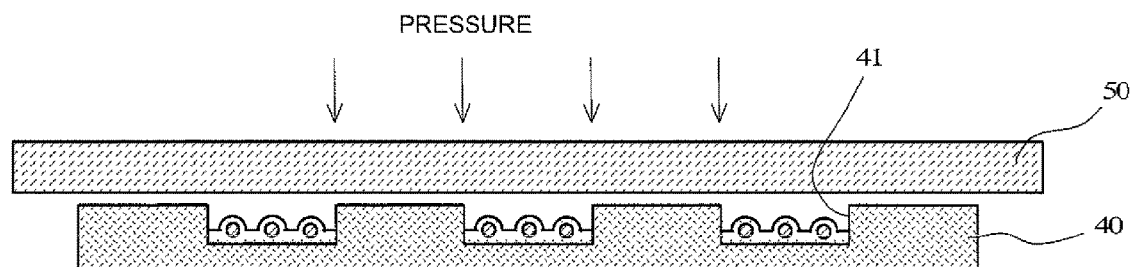
FIG. 4B is a diagram illustrating a step in the anisotropic conductive film production method using the transfer die.
Figure 4C:
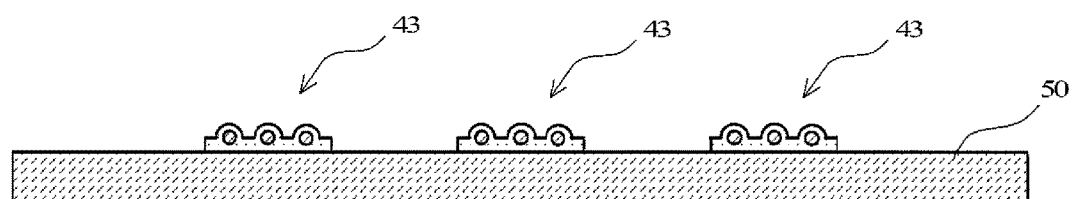
FIG. 4C is a diagram illustrating a step in the anisotropic conductive film production method using the transfer die.
Figure 4D:
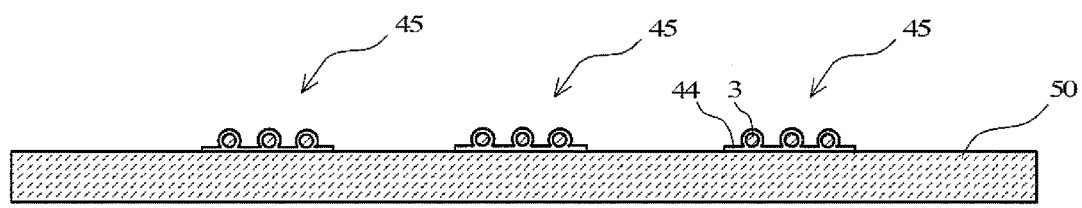
FIG. 4D is a diagram illustrating a step in the anisotropic conductive film production method using the transfer die.

Next, a release film 50 is placed on and pressed against the surface of the transfer die 40 on which the dents 41 are formed (FIG. 4B), and the coated conductive particle groups 43 are thereby transferred to the release film 50 (FIG. 4C) and then dried. A liner or island-shaped coated conductive particle group pattern 45 in which the conductive particles 3 are secured on the release film 50 through the thermoplastic resin 44 is thereby formed (FIG. 4D).

<Step of Laminating Insulating Resin Layer>

Figure 4E:
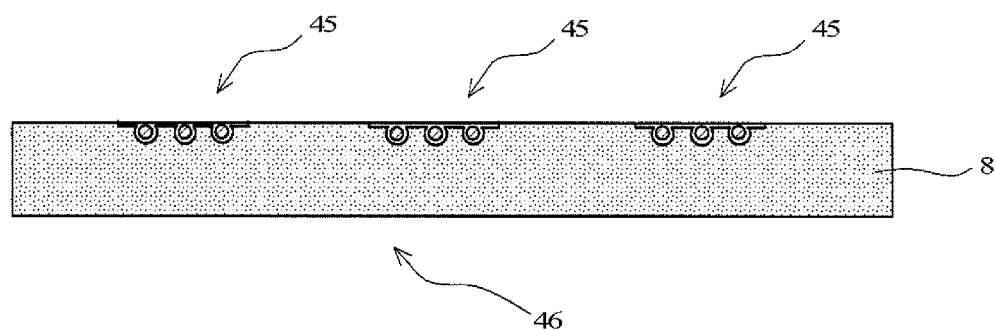
FIG. 4E is a diagram illustrating a step in the anisotropic conductive film production method using the transfer die.

Next, an insulating resin layer 8 is laminated onto the coated conductive particle group pattern 45, and then the release film 50 is removed, whereby an anisotropic conductive film 46 in this embodiment in which the coated conductive particle group pattern 45 and the insulating resin layer 8 are laminated can be obtained (FIG. 4E).

<<<Anisotropic Conductive Film Production Method C of the Present Invention>>

The anisotropic conductive film production method of the present invention can also be embodied in various other modes. For example, the conductive particle-containing layer 7 may be formed as follows. The insulating resin layer 8 is formed in advance, and the particle dispersion 1 is applied to the insulating resin layer 8 and dried to form the conductive particle-containing layer 7. In this case, an anisotropic conductive film 10 in which the conductive particle-containing layer 7 and the insulating resin layer 8 are laminated can be obtained without using the release substrate 5.

An anisotropic conductive film 10 may also be produced as follows. After the conductive particle-containing layer 7 is formed as shown in FIG. 1, an insulating resin layer-forming paint is applied directly to the conductive particle-containing layer 7 and then dried or cured.

<<Anisotropic Conductive Connection and Connected Assembly Using Anisotropic Conductive Film of the Present Invention>>

The anisotropic conductive film of the present invention can be preferably used when a first electronic component (a mounting component such as an IC chip or an IC module) and a second electronic component (a substrate such as a flexible substrate or a glass substrate) are subjected to anisotropic conductive connection. In this case, the anisotropic conductive film is temporarily applied to the second electronic component, and the first electronic component is temporarily placed on the anisotropic conductive film temporarily applied to the second electronic component. Next, preferably, the first electronic component, the anisotropic conductive film, and the second electronic component are heated and pressurized or irradiated with light. More preferably, the heating and pressurization are performed through the first electronic component, or the irradiation with light is performed through the second electronic component. The heating and pressurization may be performed simultaneously with the irradiation with light, or the irradiation with light may be performed after the heating and pressurization are started.

The above connection method using the anisotropic conductive film of the present invention and the connected assembly composed of the first electronic component and the second electronic component obtained by the connection method are also encompassed by the present invention.

EXAMPLES

The present invention will next be specifically described by way of Examples.

Examples 1 to 5 and Comparative Examples 1 and 2

(1) Preparation of Particle Dispersion

Resin core NiAu-plated particles having an average particle diameter of 4 μm (AUL704, SEKISUI CHEMICAL Co., Ltd.) were used as the conductive particles, and 1.5 g of the conductive particles were dispersed in 150 mL of ethanol. Separately, an ethylene-vinyl acetate copolymer resin (EVA) (EVATATE, model: D2045, Sumitomo Chemical Co., Ltd., Vicat softening temperature: 83° C.) was used as the thermoplastic resin forming a coating after drying, and toluene solutions of EVA having three different solid concentrations (2 wt %, 8 wt %, and 15 wt %) shown in TABLE 1 were prepared. While 5 mL of one of the toluene solutions of EVA was added dropwise to the above-prepared conductive particle dispersion, the mixture was subjected to dispersion for 10 minutes using an ultrasonic homogenizer to thereby obtain a particle dispersion.

(2) Formation of Conductive Particle-Containing Layer

One of the particle dispersions obtained in (1) was applied to a PET film using a bar coater such that the coating film had a thickness (before drying) L1 (see FIG. 1($b$)) shown in TABLE 1, and then the coating film was dried in hot air at 100° C. for 3 minutes to thereby form a conductive particle-containing layer. The interparticle distance L2 (see FIG. 1($c$)) of the conductive particles coated with EVA in the conductive particle-containing layer after drying is shown in TABLE 1. The thickness L1 of the coating film of the particle dispersion before drying and the interparticle distance L2 after drying were determined as follows. A metallurgical microscope (magnification: 100×) was used to measure the thickness L1 of the coating film and the interparticle distance L2 for conductive particles (N=20) in a given 100 μm square region, and the average values were used.

(3) Production of Anisotropic Conductive Film

Raw material components for an insulating resin layer shown in TABLE 1 were mixed, and the mixture was applied to a PET film using a bar coater and dried in hot air at 70° C. for 5 minutes to produce an insulating resin film. The insulating resin film was laminated onto one of the above-produced conductive particle-containing layers using a laminator (roll surface temperature: 45° C.) to produce an anisotropic conductive film 10 having a layer thickness L3 (see FIG. 1($d$)) of 20 μm on the PET film (Examples 1 to 5).

Separately, 20 parts by mass of the same conductive particles as those used in the Examples were used for 100 parts by mass of a mixture of raw material components of an insulating resin layer shown in TABLE 1, and an anisotropic conductive film having a layer thickness of 20 μm and containing the conductive particles arranged in a single layer was produced according to a biaxial stretching method described in Japanese Patent No. 4789738 (Comparative Example 1).

A mixture was prepared by adding 20 parts by mass of the same conductive particles as those used in the Examples to 100 parts by mass of a mixture of raw material components of an insulating resin layer shown in TABLE 1. The mixture was applied to a PET film using a bar coater and dried in hot air at 70° C. for 5 minutes to produce an anisotropic conductive film having a layer thickness of 20 μm (Comparative Example 2).

Figure 2:
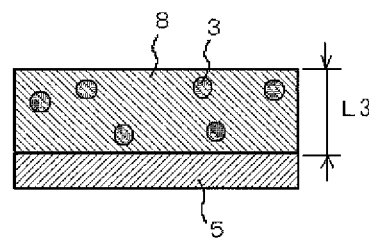
FIG. 2 is a cross-sectional view of an anisotropic conductive film in a Comparative Example.

In the anisotropic conductive film in Comparative Example 2, as shown in FIG. 2, the conductive particles 3 were randomly dispersed in layers in the insulating resin layer 8 on the PET film 5 and the layer thickness L3 was 20 μm.

Examples 6 to 11

(1) Preparation of Particle Dispersion

The same particle dispersion as that prepared in Example 1 was prepared.

(2) Formation of Coated Conductive Particle Group Pattern

The particle dispersion obtained in (1) was applied to a transfer die shown in FIG. 3A (Examples 6 to 8) or FIG. 3B and having a depth of 10 μm and a pattern width (groove width or recess width) shown in TABLE 1 using a bar coater to a coating film thickness (before drying) L1 (see FIG. 1(b)) shown in TABLE 1. The particle dispersion not present within the grooves or recesses was removed using a wiper, and then the particle dispersion filling the grooves or recesses was transferred to a PET release film. The transferred particle dispersion was dried in hot air at 100° C. for 3 minutes to form a coated conductive particle group pattern. The interparticle distance L2 (see FIG. 1(c)) of the conductive particles coated with EVA in the coated conductive particle group after drying is shown in TABLE 1. The thickness L1 of the coating film of the particle dispersion before drying and the interparticle distance L2 after drying were determined as follows. A metallurgical microscope (magnification: 100×) was used to measure the thickness L1 of the coating film and the interparticle distance L2 for conductive particles (N=20) in a given 100 μm square region, and the average values were used.

(3) Production of Anisotropic Conductive Film

Raw material components for an insulating resin layer shown in TABLE 1 were mixed, and the mixture was applied to a PET film using a bar coater and dried in hot air at 70° C. for 5 minutes to produce an insulating resin film. The insulating resin film was laminated onto one of the above-produced coated conductive particle group patterns using a laminator (roll surface temperature: 45° C.) to produce an anisotropic conductive film 10 having a layer thickness L3 (see FIG. 1(d)) of 20 μm on the PET film (Examples 6 to 11).

<<Evaluation of Characteristics of Anisotropic Conductive Films>>

(A) Rate of Occurrence of Short Circuit

One of the anisotropic conductive films in the Examples and Comparative Examples was cut into a piece of 35 mm×20 mm, and this piece was applied to ITO glass (t =0.7 mm). An IC (1.5 mm×13 mm, t=0.5 mm, Au-plated bumps: 25 μm×140 μm, h=15 μm, bump spacing: 7.5 μm) was compression-bonded using an alignment mounting facility (compression-bonded conditions: 180° C., 70 MPa, 5 seconds, cushioning material: polytetrafluoroethylene t=50 μm). The thus-obtained connected assembly was stored at 85° C. and 85% RH for 250 hours, and the rate of occurrence of a short circuit was determined before and after the storage. The results are shown in TABLE 1. Practically, the rate of occurrence is preferably 100 ppm or less. The rate of occurrence of a short circuit is computed as "the number of short circuits/the total number of 7.5 μm spaces."

(B) Conduction Resistance

One of the anisotropic conductive films in the Examples and Comparative Examples was cut into a piece of 35 mm×24 mm, and this piece was applied to ITO glass (t =0.7 mm). An IC (1.8 mm×20 mm, t=0.5 mm, Au-plated bumps: 30 μm×85 μm, h=15 μm) was compression-bonded using an alignment mounting facility (compression-bonded conditions: 180° C., 70 MPa, 5 seconds, cushioning material: polytetrafluoroethylene t=50 μm). The thus-obtained connected assembly was stored at 85° C. and 85% RH for 250 hours, and the conduction resistance was measured before and after the storage. The results are shown in TABLE 1. Practically, the conduction resistance is preferably 10Ω or less. The conduction resistance measured is the resistance between a bump of the IC and a panel electrode.

TABLE 1

| | | | | Example | | | | | | |
|---|---|---|---|---|---|---|---|---|---|---|
| | | | | 1 | 2 | 3 | 4 | 5 | 6 | 7 |
| Raw Material Components of Insulating Resin Layer | Phenoxy Resin (YP-50, Nippon Steel & Sumikin Chemical Co., Ltd.) | | | 50 | 50 | 50 | 50 | 50 | 50 | 50 |
| | Epoxy Resin (EP828, Mitsubishi Chemical Corporation) | | | 40 | 40 | 40 | 40 | — | 40 | 40 |
| | Acrylic Resin (EB-600, Daicel-Allnex Ltd.) | | | — | — | — | — | 40 | — | — |
| | Curing Agent | Cationic System | SAN-AID SU-60 (Sanshin Chemical Industry Co., Ltd.) | 10 | 10 | 10 | — | — | 10 | 10 |
| | | Anionic System | NOVACURE HX-3941HP (Asahi Kasei E-Materials Corporation) | — | — | — | 10 | — | — | — |
| | | Radical System | Perbutyl O (NOF Corporation) | — | — | — | — | 10 | — | — |
| Arrangement of Conductive Particles in Single Layer | | | | Yes | Yes | Yes | Yes | Yes | Yes | Yes |
| EVA Coating on Conductive Particles | | | | Yes | Yes | Yes | Yes | Yes | Yes | Yes |
| Concentration of Solid in Toluene Solution of EVA | | | | 2 | 8 | 15 | 8 | 8 | 8 | 8 |
| Thickness of Coating Film in Conductive Particle-Containing Layer before Drying(L1)(μm) | | | | 1.3 | 2.73 | 6.68 | 2.73 | 2.72 | 2.91 | 2.84 |
| Interparticle Distance of Coated Conductive Particles after Drying(L2)(μm) | | | | 0.95 | 2.19 | 5.34 | 2.19 | 2.19 | 2.35 | 2.29 |
| Pattern of Coated Conductive Particles | | | | No | No | No | No | No | Linear | Linear |

TABLE 1-continued

|  |  |  |  |  |  |  |  |  |
|---|---|---|---|---|---|---|---|---|
| Pattern Width(μm) |  | — | — | — | — | — | 10 | 20 |
| Rate of Occurrence of Short Circuit | Initial | ≤50 ppm | ≤50 ppm | ≤50 ppm | ≤50 ppm | ≤50 ppm | ≤50 ppm | ≤50 ppm |
|  | 85° C., 85%, 250 hr | ≤50 ppm | ≤50 ppm | ≤50 ppm | ≤50 ppm | ≤50 ppm | ≤50 ppm | ≤50 ppm |
| Conduction Resistance (Ω) | Initial | 0.2 | 0.2 | 0.2 | 0.2 | 0.2 | 0.2 | 0.2 |
|  | 85° C., 85%, 250 hr | 1.1 | 1.3 | 1.2 | 1.2 | 1.2 | 1.4 | 1.3 |

|  |  |  |  | Example |  |  |  | Comparative Example |  |
|---|---|---|---|---|---|---|---|---|---|
|  |  |  |  | 8 | 9 | 10 | 11 | 1 | 2 |
| Raw Material Components of Insulating Resin Layer | Phenoxy Resin (YP-50, Nippon Steel & Sumikin Chemical Co., Ltd.) |  |  | 50 | 50 | 50 | 50 | 50 | 50 |
|  | Epoxy Resin (EP828, Mitsubishi Chemical Corporation) |  |  | 40 | 40 | 40 | 40 | 40 | 40 |
|  | Acrylic Resin (EB-600, Daicel-Allnex Ltd.) |  |  | — | — | — | — | — | — |
|  | Curing Agent | Cationic System | SAN-AID SU-60 (Sanshin Chemical Industry Co., Ltd.) | 10 | 10 | 10 | 10 | 10 | 10 |
|  |  | Anionic System | NOVACURE HX-3941HP (Asahi Kasei E-Materials Corporation) | — | — | — | — | — | — |
|  |  | Radical System | Perbutyl O (NOF Corporation) | — | — | — | — | — | — |
| Arrangement of Conductive Particles in Single Layer |  |  |  | Yes | Yes | Yes | Yes | Yes | No |
| EVA Coating on Conductive Particles |  |  |  | Yes | Yes | Yes | Yes | No | No |
| Concentration of Solid in Toluene Solution of EVA |  |  |  | 8 | 8 | 8 | 8 |  |  |
| Thickness of Coating Film in Conductive Particle-Containing Layer before Drying(L1)(μm) |  |  |  | 2.79 | 2.93 | 2.87 | 2.81 |  |  |
| Interparticle Distance of Coated Conductive Particles after Drying(L2)(μm) |  |  |  | 2.21 | 2.36 | 2.31 | 2.23 | 3.14 |  |
| Pattern of Coated Conductive Particles |  |  |  | Linear | Island | Island | Island | No | No |
| Pattern Width(μm) |  |  |  | 50 | 10 | 20 | 50 | — | — |
| Rate of Occurrence of Short Circuit | Initial |  |  | ≤50 ppm | ≤50 ppm | ≤50 ppm | ≤50 ppm | 500 ppm | 800 ppm |
|  | 85° C., 85%, 250 hr |  |  | ≤50 ppm | ≤50 ppm | ≤50 ppm | ≤50 ppm | 500 ppm | 800 ppm |
| Conduction Resistance (Ω) | Initial |  |  | 0.2 | 0.2 | 0.2 | 0.2 | 0.2 | 0.2 |
|  | 85° C., 85%, 250 hr |  |  | 1.2 | 1.4 | 1.3 | 1.2 | 1.2 | 1.2 |

As can be seen from TABLE 1, the conduction resistance of each of the anisotropic conductive films in Examples 1 to 11 was small, as in the anisotropic conductive film in Comparative Example 1 in which the conductive particles were arranged in a single layer using the biaxial stretching method and the anisotropic conductive film in Comparative Example 2 in which the conductive particles were randomly dispersed in layers. However, the rate of occurrence of a short circuit in each of the anisotropic conductive films in Examples 1 to 11 was lower than that in Comparative Examples 1 and 2. This shows that variations in interparticle distance are small in the anisotropic conductive films in the Examples. Therefore, according to the Examples of the present invention, a low conduction resistance can be obtained while the rate of occurrence of a short circuit is reduced.

As can be seen from the results in Examples 1 to 3, the interparticle distance of the conductive particles can be changed by changing the concentration of EVA present as a solid. As can be seen from the results in Examples 2, 4, and 5, the results for the rate of occurrence of a short circuit and the conduction resistance are the same irrespective of whether the curing system of the insulating resin is a radical curing system, an anionic curing system, or a cationic curing system. As can be seen from the results in Examples 6 to 11, the results for the rate of occurrence of a short circuit and the conduction resistance are the same irrespective of whether the transfer die used for producing the anisotropic conductive film has a linear pattern or an island pattern. As can be seen from these results, as the pattern width increases, the value of the conduction resistance tends to decrease. As can be seen from these results, when a transfer die having a linear pattern or an island pattern is used to produce an anisotropic conductive film, L1 and L2 tend to be larger than those in Example 2 in which no transfer die was used. This may be because the influence of pressure becomes larger.

REFERENCE SIGNS LIST

1 particle dispersion
2 dilute thermoplastic resin solution
3 conductive particle
4 coated conductive particle
5 release substrate or PET film
6a dried coating film of thermoplastic resin on release substrate
6b dried coating of thermoplastic resin with which conductive particles are coated
7 conductive particle-containing layer
8 insulating resin layer
10, 46 anisotropic conductive film
30A, 30B, 40 transfer die
31 groove
32 recess 41 dent
43 conductive particle group
44 thermoplastic resin
45 coated conductive particle group pattern
50 release film

The invention claimed is:

1. An anisotropic conductive film comprising:
a conductive particle-containing layer including coated conductive particles that are coated with a thermoplastic resin while arranged in a single layer, wherein the coated conductive particles form conductive particle groups with a regular pattern and any conductive particle group is apart from other conductive particle groups; and
an insulating resin layer laminated onto the conductive particle-containing layer.

2. The anisotropic conductive film according to claim 1, wherein the thermoplastic resin is an ethylene-vinyl acetate copolymer resin.

3. The anisotropic conductive film according to claim 1, wherein an interparticle distance of the coated conductive particles is 1 to 6 μm.

4. A method of connecting a terminal of a first electronic component to a terminal of a second electronic component by anisotropic conductive connection using an anisotropic conductive film, the method comprising:
temporarily applying the anisotropic conductive film according to claim 1 onto the second electronic component;
temporarily placing the first electronic component on the temporarily applied anisotropic conductive film on the second electronic component; and
then heating and pressurizing the first electronic component, the anisotropic conductive film, and the second electronic component.

5. The method of connecting according to claim 4, wherein the first electronic component is a mounting component and the second electronic component is a substrate, and the heating and the pressurization applied to the first electronic component, the anisotropic conductive film, and the second electronic component are performed through the first electronic component with a heating tool.

6. A connected assembly comprising a first electronic component and a second electronic component, wherein a terminal of the first electronic component and a terminal of the second electronic component is connected by anisotropic conductive connection through the anisotropic conductive film according to claim 1.

7. A method of producing a connected assembly comprising a first electronic component and a second electronic component, wherein the method comprises connecting a terminal of the first electronic component and a terminal of the second electronic component by anisotropic conductive connection through the anisotropic conductive film according to claim 1.

8. An anisotropic conductive film comprising:
conductive particles arranged in a single layer, wherein a plurality of the conductive particles form conductive particle groups with a regular pattern and any conductive particle group is apart from other conductive particle groups; and
an insulating resin layer, wherein the conductive particle groups are laminated onto the insulating resin layer.

9. The anisotropic conductive film according to claim 8, wherein an interparticle distance of the conductive particles in the conductive particle groups is 0.5 to 10 μm.

10. The anisotropic conductive film according to claim 8, wherein each of the conductive particle group is a rectangle having a width of 5 to 200 μm.

11. The anisotropic conductive film according to claim 8, wherein the conductive particle groups with a regular pattern formed from a plurality of conductive particles are held in a single layer by an insulating resin layer containing a thermoplastic resin.

12. The anisotropic conductive film according to claim 11, wherein the thermoplastic resin has a softening point of 50 to 90 °C.

13. A method of connecting a terminal of a first electronic component to a terminal of a second electronic component by anisotropic conductive connection using an anisotropic conductive film, the method comprising:
temporarily applying the anisotropic conductive film according to claim 8 onto the second electronic component;
temporarily placing the first electronic component on the temporarily applied anisotropic conductive film on the second electronic component; and
then heating and pressurizing the first electronic component, the anisotropic conductive film, and the second electronic component.

14. The method of connecting according to claim 13, wherein the first electronic component is a mounting component and the second electronic component is a substrate, and the heating and the pressurization applied to the first electronic component, the anisotropic conductive film, and the second electronic component are performed through the first electronic component with a heating tool.

15. A connected assembly comprising a first electronic component and a second electronic component, wherein a terminal of the first electronic component and a terminal of the second electronic component is connected by anisotropic conductive connection through the anisotropic conductive film according to claim 8.

16. A method of producing a connected assembly comprising a first electronic component and a second electronic component, wherein the method comprises connecting a terminal of the first electronic component and a terminal of the second electronic component by anisotropic conductive connection through the anisotropic conductive film according to claim 8.

* * * * *